United States Patent
Zhu et al.

(10) Patent No.: US 8,633,042 B2
(45) Date of Patent: Jan. 21, 2014

(54) LIGHT EMITTING DIODE

(75) Inventors: Jun Zhu, Beijing (CN); Peng Ji, Beijing (CN); Feng-Lei Yang, Beijing (CN); Guo-Fan Jin, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 46 days.

(21) Appl. No.: 12/911,888

(22) Filed: Oct. 26, 2010

(65) Prior Publication Data

US 2011/0254021 A1 Oct. 20, 2011

(30) Foreign Application Priority Data

Apr. 16, 2010 (CN) .......................... 2010 1 0148893

(51) Int. Cl.
*H01L 21/00* (2006.01)

(52) U.S. Cl.
USPC .. 438/29; 438/98; 257/E33.067; 257/E33.074

(58) Field of Classification Search
USPC ................ 438/29; 257/98, E33.067, E33.074
See application file for complete search history.

(56) References Cited

U.S. PATENT DOCUMENTS

| 6,657,236 B1 * | 12/2003 | Thibeault et al. ................ 257/98 |
| 2005/0199895 A1 * | 9/2005 | Seong et al. .................... 257/94 |
| 2005/0263779 A1 | 12/2005 | Hon et al. |
| 2008/0035953 A1 * | 2/2008 | Beom et al. .................... 257/103 |
| 2008/0166506 A1 * | 7/2008 | Shin et al. ........................ 428/29 |
| 2008/0179606 A1 * | 7/2008 | Usuda et al. .................... 257/94 |

FOREIGN PATENT DOCUMENTS

| CN | 1862843 | | 11/2006 |
| CN | 101572286 | | 11/2009 |
| CN | 101572286 A | * | 11/2009 |
| WO | WO2004112157 | | 12/2004 |
| WO | WO 2004112157 A1 | * | 12/2004 |

* cited by examiner

*Primary Examiner* — Michael Lebentritt
*Assistant Examiner* — Aaron Dehne
(74) *Attorney, Agent, or Firm* — Altis Law Group, Inc.

(57) ABSTRACT

A light emitting diode includes a substrate, a first semiconductor layer, an active layer, a second semiconductor layer, a first electrode, a transparent conductive layer, a second electrode and a metal grating. The first semiconductor layer, the active layer, and the second semiconductor layer are orderly stacked on the substrate. The first electrode is electrically connected to the first semiconductor layer. The transparent conductive layer is located on a surface of the second semiconductor layer away from the substrate. The second electrode is electrically connected to the transparent conductive layer. The metal grating is located on a surface of the transparent conductive layer away from the substrate. The metal grating is a two-dimensional array of a plurality of metal micro-structures.

20 Claims, 2 Drawing Sheets

US 8,633,042 B2

LIGHT EMITTING DIODE

CROSS-REFERENCE TO RELATED APPLICATIONS

This application claims all benefits accruing under 35 U.S.C. §119 from China Patent Application No. 201010148893.6, filed on Apr. 16, 2010, in the China Intellectual Property Office, the contents of which are hereby incorporated by reference.

BACKGROUND

1. Technical Field

The present disclosure relates to a light emitting diode (LED).

2. Description of Related Art

In recent years, highly efficient LEDs made with GaN-based semiconductors have become widely used in different technologies, such as in display devices, large electronic bill boards, street lights, car lights, and other illumination applications. LEDs are environmentally friendly, long working life, and low power consumption.

A conventional LED commonly includes an N-type semiconductor layer, a P-type semiconductor layer, an active layer, an N-type electrode, and a P-type electrode. The active layer is located between the N-type semiconductor layer and the P-type semiconductor layer. The P-type electrode is located on the P-type semiconductor layer. The N-type electrode is located on the N-type semiconductor layer. Typically, the P-type electrode is transparent. In operation, a positive voltage and a negative voltage are applied respectively to the P-type semiconductor layer and the N-type semiconductor layer. Thus, holes in the P-type semiconductor layer and electrons in the N-type semiconductor layer can enter the active layer and combine with each other to emit visible light.

However, extraction efficiency of LEDs is low because typical semiconductor materials have a higher refraction index than that of air. Large-angle light emitted from the active layer may be internally reflected in LEDs, so that a large portion of the light emitted from the active layer will remain in the LEDs, thereby degrading the extraction efficiency.

A method for reducing internal reflection is to roughen a surface of an LED from which light is emitted to change an angle of incidence of the light. However, this only affects light having small incidence angles. Therefore, the large-angle light cannot be efficiently emitted by the LED.

What is needed, therefore, is an LED, which can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
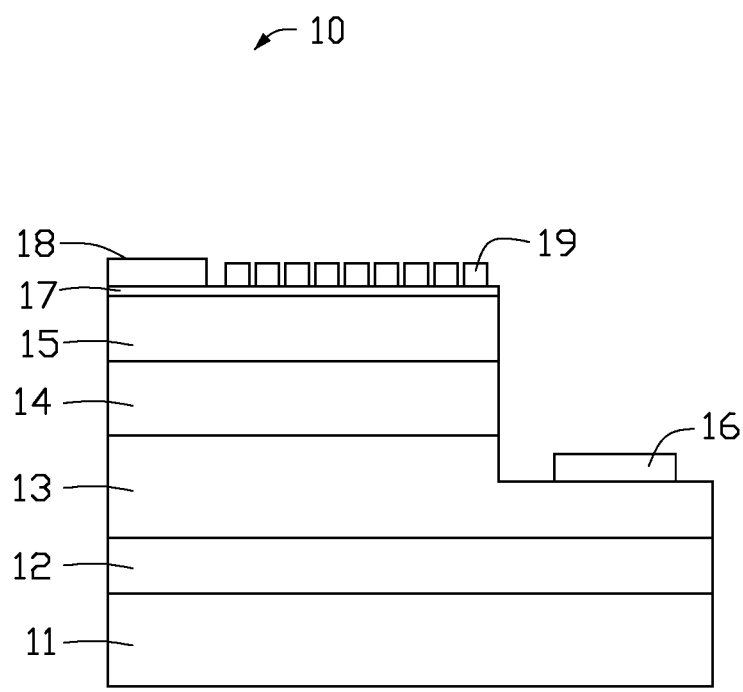
FIG. 1 is a schematic structural view of an embodiment of an LED.

Referring to FIG. 1, an embodiment of a LED 10 includes a substrate 11, a first semiconductor layer 13, an active layer 14, a second semiconductor layer 15, a first electrode 16, a transparent conductive layer 17, a second electrode 18, and a metal grating 19. The first semiconductor layer 13, the active layer 14, the second semiconductor layer 15 are orderly stacked on the substrate 11. The first electrode 16 is electrically connected to the first semiconductor layer 13. The transparent conductive layer 17 is located on a top surface of the second semiconductor layer 15 away from the substrate 11. The metal grating 19 is located on a top surface of the transparent conductive layer 17 away from the substrate 11. The metal grating 19 includes a two-dimensional array of metal micro-structures. The second electrode 18 is located on the top surface of the transparent conductive layer 17 away from the substrate 11 and electrically connected to the transparent conductive layer 17.

The substrate 11 is configured to support other elements, such as the first semiconductor layer 13 and the second semiconductor layer 15. The substrate 11 can have a thickness of about 300 micrometers (μm) to about 500 μm. The substrate 11 can be made of sapphire, gallium arsenide, indium phosphate, silicon nitride, gallium nitride, zinc oxide, aluminum silicon nitride, silicon carbon, or their combinations. In one embodiment, the substrate 11 is made of sapphire and has a thickness of about 400 μm.

Further, a buffer layer 12 may be interposed between the substrate 11 and the first semiconductor layer 13. The buffer layer 12 contacts both the substrate 11 and a bottom surface of the first semiconductor layer 13. Understandably, if the buffer layer 12 is not used, the bottom surface of the first semiconductor layer 13 is located directly on a surface of the substrate 11. The buffer layer 12 improves epitaxial growth and decrease lattice mismatch. The buffer layer 12 can be made of gallium nitride (GaN), aluminum nitride (AlN), or the like. In one embodiment, the buffer layer 12 is formed on the substrate 11 and made of GaN. The buffer layer 12 can have a thickness of about 20 nanometers (nm) to about 50 nm.

The first semiconductor layer 13 can have a step-shaped structure and includes the bottom surface, a lower top surface, and an upper surface, all substantially parallel to each other. The bottom surface, the lower top surface, and the upper top surface of the first semiconductor layer 13 have different heights to form the step-shaped structure. The lower and upper top surfaces of the first semiconductor layer 13 are opposite to the bottom surface. Compared to the bottom surface of the first semiconductor layer 13, a height of the lower top surface of the first semiconductor layer 13 is lower than a height of the upper top surface of the first semiconductor layer 13. A distance between the lower top surface and the bottom surface of the first semiconductor layer 13 is shorter than a distance between the upper top surface and the bottom surface of the first semiconductor layer 13. The active layer 14 and the second semiconductor layer 15 are arranged on the upper top surface of the first semiconductor layer 13. In one embodiment, a contacting area between the upper top surface of the first semiconductor layer 13 and the active layer 14 is approximately equal to a total area of the upper top surface. The second semiconductor layer 15 fully covers a top surface of the active layer 14 away from the substrate 11. In one embodiment, the upper top surface and the lower top surface of the first semiconductor layer 13 are in a same plane, which means that the height of the upper top surface and the lower top surface compared to the bottom surface is approximately equal. The active layer 14 and the second semiconductor layer 15 are orderly stacked on the upper top surface of the first semiconductor layer 13 to form the step-shaped structure. The first electrode 16 is located on the lower top surface of the first semiconductor layer 13.

If the first semiconductor layer 13 is an N-type semiconductor, the second semiconductor layer 15 is a P-type semiconductor, and vice versa. The N-type semiconductor layer provides electrons, and the P-type semiconductor layer provides cavities. The N-type semiconductor layer can be made of N-type gallium nitride, N-type gallium arsenide, or N-type copper phosphate. The P-type semiconductor layer can be made of P-type gallium nitride, P-type gallium arsenide, or P-type copper phosphate. The first semiconductor layer 13 can have a thickness of about 1 μm to about 5 μm. The second semiconductor layer 15 can have a thickness of about 0.1 μm to about 3 μm. In one embodiment, the first semiconductor layer 13 is an N-type semiconductor, and a distance between the bottom surface and the upper top surface of the first semiconductor layer 13 is about 0.3 μm. The first semiconductor layer 13 is made of N-type gallium nitride, and the second semiconductor layer 15 is a P-type semiconductor. The second semiconductor layer 15 has a thickness of about 0.3 μm and is made of P-type gallium nitride. A distance between the lower top surface of the first semiconductor layer 13 and the top surface of the second semiconductor layer 15, which is away from the substrate 11, is about 0.8 μm.

The active layer 14 is located on the upper top surface of the first semiconductor layer 13. The active layer 14 is a photon exciting layer and can be one of a single quantum well layer or multilayer quantum well films. The active layer 14 can be made of gallium indium nitride (GaInN), aluminum indium gallium nitride (AlGaInN), gallium arsenide (GaSn), aluminum gallium arsenide (AlGaSn), gallium indium phosphide (GaInP), or aluminum gallium arsenide (GaInSn). The active layer 14, in which the electrons fill the holes, can have a thickness of about 0.01 μm to about 0.6 μm. In one embodiment, the active layer 14 has a thickness of about 0.3 μm and includes one layer of GaInN stacked with a layer of GaN.

The transparent conductive layer 17 includes at least a gold layer or a silver layer. If the transparent conductive layer 17 has a gold layer, the transparent conductive layer 17 can have a thickness of about 1 nm to about 10 nm. If the transparent conductive layer 17 includes a gold layer or a silver layer, a nickel layer may be interposed between the transparent conductive layer 17 and the second semiconductor layer 15. The nickel layer can enhance a bonding force between the gold layer and the second semiconductor layer 15 or a bonding force between the silver layer and the second semiconductor layer 15. The transparent conductive layer 17 can have a thickness of about 1 nm to about 10 nm. If the transparent conductive layer 17 includes the indium tin oxide layer, the transparent conductive layer 17 can have a thickness of about 10 nm to about 200 nm. In one embodiment, the transparent conductive layer 17 includes a nickel layer and a gold layer. The nickel layer has a thickness of about 5 nm. The gold layer has a thickness of about 5 nm. The nickel layer contacts a top surface of the second semiconductor layer 15 which is away from the substrate 11. The gold layer is located on a top surface of the nickel layer away from the substrate 11. The transparent conductive layer 17 provides a uniform current to the second semiconductor layer 15.

Figure 2:
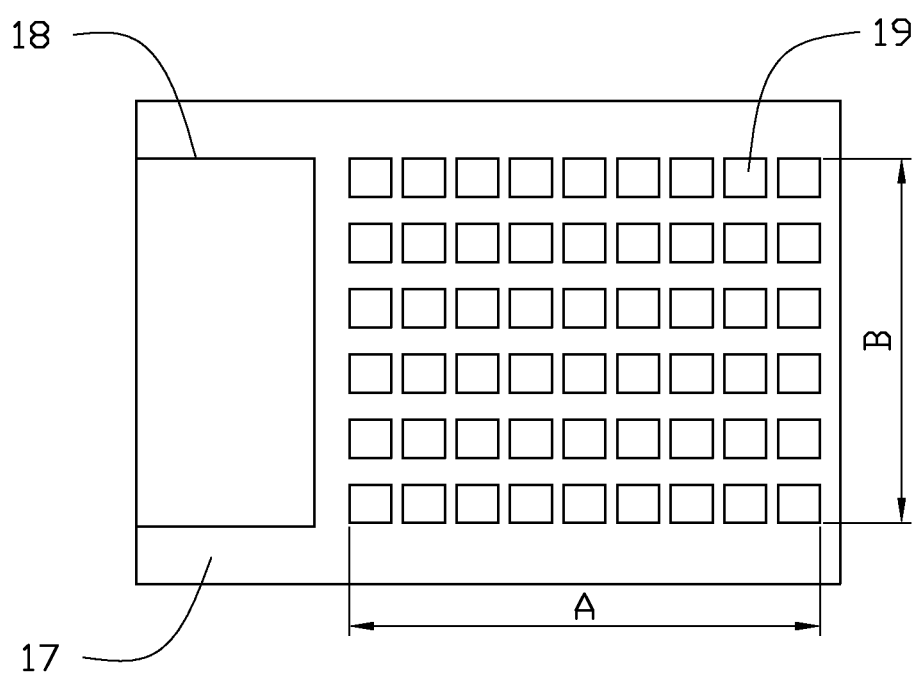
FIG. 2 is a top-view of the LED of FIG. 1.

Referring to FIG. 2, the metal grating 19 is a two-dimensional array of a plurality of metal micro-structures. The two-dimensional array includes a plurality of rows of metal micro-structures and a plurality of columns of metal micro-structures. Along each of the plurality of rows or each of the plurality of columns, the metal micro-structures are spaced apart from each other and periodically arranged. A distance between each two adjacent metal micro-structures can be approximately equal along each of the rows or each of the columns. A shape of the metal micro-structure can be tapered, cuniform, columned, or prism-shaped. In one embodiment, the metal micro-structure is a plurality of metal cuboids. A height of each of the metal cuboids can range from about 20 nm to about 1020 nm. A length and a width of each of the metal cuboids can range from about 60 nm to about 120 nm. In one embodiment, the height of each of the metal cuboids can range from about 20 nm to about 100 nm, a distance between two centerlines of two adjacent metal cuboids can range from about 200 nm to about 1000 nm. The two metal cuboids are considered adjacent if they are next to each other in one row or in one column.

The array of metal cuboids is made of gold or silver. In one embodiment, the array of metal cuboids is made of silver so as to improve the extraction efficiency of the LED. In one embodiment, the height of each of the metal cuboids is about 50 nm, and the length and the width of each of the metal cuboids are about 85 nm. A distance between two centerlines of two adjacent metal cuboids is about 680 nm.

Further, a silicon dioxide film may be formed on exposed surfaces of the metal cuboids. The silicon dioxide film can have a thickness of about 2 nm to about 20 nm. The silicon dioxide film does not cover portions of the transparent conductive layer 17 which contacts with the metal cuboids. In one embodiment, the silicon dioxide film has a thickness of about 3 nm to about 5 nm. The silicon dioxide film can prevent the silver cuboids from being oxidized.

A duty factor is used to describe the structure of the array of the metal cuboids. The duty factor is a ratio of a length of one side of one metal cuboid of the metal cuboids and a distance between the center point of that metal cuboid and the center point of the metal cuboid adjacent to the one side. In one embodiment, a duty factor among adjacent cuboids in a row and among adjacent cuboid in a column can range from about 0.06:1 to about 0.6:1. Referring to FIG. 2, the row's direction of the metal grating 19 is in an A direction, and the column direction of the metal grating 19 is in a B direction. The extraction efficiency of the LED 10 can be improved by controlling the duty factor of the LED 10.

The first electrode 16 may be a P-type or an N-type electrode and is the same type as the first semiconductor layer 13. The second electrode 18 may be a P-type or an N-type electrode and is the same type as the second semiconductor layer 15. A thickness of the first electrode 16 can range from about 0.01 μm to about 2 μm. A thickness of the second electrode 18 can range from about 0.01 μm to about 2 μm. The first electrode 16 can be made of titanium, aluminum, nickel, gold, or a combination thereof. In one embodiment, the first electrode 16 is a P-type electrode and includes a nickel layer and a gold layer. A thickness of the nickel layer is about 150 angstroms. A thickness of the gold layer is about 1000 angstroms. In one embodiment, the second electrode 18 is an N-type electrode and includes a titanium layer and a gold layer. A thickness of the titanium layer is about 150 angstroms. A thickness of the gold layer is about 2000 angstroms. In one embodiment, the first electrode 16 is located on the second surface of the first semiconductor layer 13, the second electrode 18 and the metal grating 19 are located on the surface of the transparent conductive layer 17 away from the substrate 11.

In one embodiment, a height of each of the metal cuboids of the metal grating is about 45 nm, a distance between two centerlines of two adjacent metal cuboids is about 270 nm, a length of each of the metal cuboids is about 85 nm, and a width of each of the metal cuboids is about 85 nm. The metal cuboids of the metal grating are made of silver. The transparent conductive layer includes a nickel layer and a gold layer. The nickel layer has a thickness of about 5 nm and the gold layer has a thickness of about 5 nm. The nickel layer contacts a surface of the second semiconductor layer from the substrate. The gold layer is located on a surface of the nickel layer which is away from the substrate. A duty factor along any column's direction and any row's direction of the metal grating is about 0.3148:1.

In one embodiment, the transparent conductive layer includes an indium tin oxide layer. A thickness of the indium tin oxide layer is about 200 nm. A height of each of the metal cuboids of the metal grating is about 55 nm, a length of each of the cuboids is 85 nm, a width of each of the cuboids is about 85 nm, and a distance between two centerlines of two adjacent metal cuboids is about 260 nm. A duty factor along any column's direction and any row's direction of the metal grating is about 0.3269:1.

In one embodiment, an LED is provided which is similar to the LED 10 illustrated in the FIG. 1. The difference is that the transparent conductive layer includes an indium tin oxide layer. A thickness of the indium tin oxide layer is about 200 nm. A height of each of the metal cuboids of the metal grating is about 50 nm, a length of each of the cuboids is about 85 nm, a width of each of the cuboids is about 85 nm, and a distance between two centerlines of two adjacent metal cuboids is about 680 nm. A duty factor along any column's direction and any row's direction of the metal grating is about 0.125:1.

Large-angle light emitting from the second semiconductor layer meets the metal grating to produce a plurality of surface plasmon resonances changing directions of travel of the large-angle light avoiding internal reflection, thus increasing extraction efficiency of the large-angle light. The surface plasmon resonances propagated along surfaces of the metal microstructures can guide and focus the light by a sub-wavelength structure to improve the transmission of the light. Therefore, the extraction efficiency of the large-angle lights can be improved by locating metal grating on the second semiconductor layer. Further, the metal grating can improve the uniformity of the emitted lights of an LED. The metal grating is made of silver because it is a material known for working well in the propagation of the surface plasmons, and so helps improve the extraction efficiency of the LED.

Finally, it is to be understood that the above-described embodiments are intended to illustrate rather than limit the disclosure. Variations may be made to the embodiments without departing from the spirit of the disclosure as claimed. Elements associated with any of the above embodiments are envisioned to be associated with any other embodiments. The above-described embodiments illustrate the scope of the disclosure but do not restrict the scope of the disclosure.

What is claimed is:

1. A light emitting diode comprising:
    a substrate;
    a first semiconductor layer, an active layer, a second semiconductor layer, wherein the first semiconductor layer, the active layer, and the second semiconductor layer are orderly stacked on the substrate;
    a first electrode electrically connected to the first semiconductor layer;
    a transparent conductive layer located on a surface of the second semiconductor layer away from the substrate;
    a second electrode electrically connected to the transparent conductive layer;
    a metal grating located on a surface of the transparent conductive layer away from the substrate, wherein the metal grating is a two-dimensional array, and the two-dimensional array comprises a plurality of metal micro-structures, and the plurality of metal micro-structures is arranged in a plurality of rows and a plurality of columns, and each of the plurality of metal micro-structures is isolated from each other.

2. The light emitting diode of claim 1, wherein the transparent conductive layer comprises a gold layer.

3. The light emitting diode of claim 2, wherein the gold layer has a thickness of about 1 nanometer to about 10 nanometers.

4. The light emitting diode of claim 1, wherein the transparent conductive layer comprises a gold layer and a nickel layer interposed between the gold layer and the second semiconductor layer.

5. The light emitting diode of claim 4, wherein the transparent conductive layer has a thickness of about 1 nanometer to about 10 nanometers.

6. The light emitting diode of claim 1, wherein the transparent conductive layer comprises an indium tin oxide layer.

7. The light emitting diode of claim 6, wherein the transparent conductive layer has a thickness of about 10 nanometers to about 200 nanometers.

8. The light emitting diode of claim 1, wherein a shape of each of the plurality of metal micro-structures is selected from the group consisting of tapered, cuniform, columned, and prism-shaped.

9. The light emitting diode of claim 1, wherein the plurality of metal micro-structures is a plurality of metal cuboids.

10. The light emitting diode of claim 9, wherein a height of each metal cuboid ranges from about 20 nanometers to about 1020 nanometers, and a length and a width of the metal cuboid both range from about 60 nanometers to about 120 nanometers.

11. The light emitting diode of claim 9, wherein a distance between two centerlines of two adjacent metal cuboids of the plurality of metal cuboids ranges from about 200 nanometers to about 1000 nanometers.

12. The light emitting diode of claim 9, wherein the plurality of metal cuboids is arranged to form a plurality of columns and a plurality of rows, and a duty factor along any row or any column ranges from about 0.06:1 to about 0.6:1.

13. The light emitting diode of claim 12, wherein a height of each metal cuboid is about 55 nanometers, a length of the metal cuboid is about 85 nanometers, a width of the metal cuboid is about 85 nanometers, a distance between two centerlines of two adjacent metal cuboids of the plurality of the metal cuboids is about 260 nanometers, and a duty factor along any column and any row of the metal cuboids is about 0.3269:1.

14. The light emitting diode of claim 12, wherein a height of each metal cuboid is about 50 nanometers, a length of each metal cuboid is about 85 nanometers, a width of each metal cuboid is about 85 nanometers, a distance between two centerlines of two adjacent metal cuboids is about 680 nanometers, and a duty factor along any column and any row of the metal cuboids is about 0.125:1.

15. The light emitting diode of claim 12, wherein a height of each metal cuboid is about 45 nanometers, a length of each metal cuboid is about 85 nanometers, a width of the metal cuboid is about 85 nanometers, a distance between two centerlines of two adjacent metal cuboids is about 270 nanometers, and a duty factor along any column and any row of the metal cuboids is about 0.3148:1.

16. The light emitting diode of claim 1, wherein the metal grating is made of gold.

17. The light emitting diode of claim 1, wherein the metal grating is made of silver.

18. The light emitting diode of claim 17, wherein a silicon dioxide film is formed on an exposed surfaces of the metal grating.

19. The light emitting diode of claim 18, wherein the silicon dioxide film has a thickness from about 2 nanometers to about 20 nanometers.

20. The light emitting diode of claim 1, wherein along each of the plurality of rows or each of the plurality of columns, the metal micro-structures are spaced apart from each other and periodically arranged.

* * * * *